United States Patent
Nakayama et al.

(10) Patent No.: US 8,222,667 B2
(45) Date of Patent: Jul. 17, 2012

(54) SEMICONDUCTOR LIGHT-EMITTING ELEMENT, METHOD FOR MANUFACTURING THE SEMICONDUCTOR LIGHT-EMITTING ELEMENT AND LAMP THAT USES THE SEMICONDUCTOR LIGHT-EMITTING ELEMENT

(75) Inventors: Tokuyuki Nakayama, Ichikawa (JP); Yoshiyuki Abe, Ichikawa (JP)

(73) Assignee: Sumitomo Metal Mining Co., Ltd, Toyko (JP)

(*) Notice: Subject to any disclaimer, the term of this patent is extended or adjusted under 35 U.S.C. 154(b) by 23 days.

(21) Appl. No.: 12/920,949

(22) PCT Filed: Mar. 5, 2009

(86) PCT No.: PCT/JP2009/054143
§ 371 (c)(1),
(2), (4) Date: Nov. 9, 2010

(87) PCT Pub. No.: WO2009/110539
PCT Pub. Date: Sep. 11, 2009

(65) Prior Publication Data
US 2011/0062485 A1   Mar. 17, 2011

(30) Foreign Application Priority Data

Mar. 6, 2008  (JP) .................................. 2008-057056
Dec. 26, 2008 (JP) .................................. 2008-332316

(51) Int. Cl.
*H01L 33/42* (2010.01)
(52) U.S. Cl. ........................ 257/99; 257/98; 257/100
(58) Field of Classification Search .................... 257/98, 257/99, 100
See application file for complete search history.

(56) References Cited

U.S. PATENT DOCUMENTS

| | | | |
|---|---|---|---|
| 7,563,514 B2* | 7/2009 | Nakayama et al. | 428/432 |
| 7,641,818 B2* | 1/2010 | Nakayama et al. | 252/518.1 |
| 7,989,244 B2* | 8/2011 | Kim et al. | 438/46 |

(Continued)

FOREIGN PATENT DOCUMENTS

| | | |
|---|---|---|
| JP | 20070182924 | 7/1995 |
| JP | 20090259640 | 10/1997 |
| JP | 20070287845 | 11/2007 |
| JP | 20070335030 | 12/2007 |
| JP | 2008285760 | 11/2008 |
| WO | WO2006030762 | 3/2006 |

*Primary Examiner* — Wai Sing Louie
*Assistant Examiner* — Bilkis Jahan
(74) *Attorney, Agent, or Firm* — Hartman & Hartman, P.C.; Gary M. Hartman; Domenica N. S. Hartmna (57) ABSTRACT

Provided are a semiconductor light-emitting element that is capable of efficiently outputting blue color or ultraviolet light, and a lamp using the semiconductor light-emitting element.

The semiconductor light-emitting element is obtained by a manufacturing method that, when manufacturing the semiconductor light-emitting element that comprises a compound semiconductor layer that includes at least a p-type semiconductor layer, and a transparent electrode that is provided on the p-type semiconductor layer, includes a step of forming a film comprising an oxide of indium and gallium, or forming a film comprising an oxide of indium, gallium and tin, in an amorphous state on the p-type semiconductor layer, so as to form a transparent conductive film, followed by a step of performing an annealing process on the transparent conductive film at a temperature of 200° C. to 480° C.

10 Claims, 4 Drawing Sheets

U.S. PATENT DOCUMENTS

| | | | |
|---|---|---|---|
| 2004/0180217 A1* | 9/2004 | Inoue et al. | 428/432 |
| 2007/0200100 A1* | 8/2007 | Nakayama et al. | 252/500 |
| 2008/0024055 A1* | 1/2008 | Marks et al. | 313/504 |
| 2008/0032106 A1* | 2/2008 | Nakayama et al. | 428/216 |
| 2008/0038529 A1* | 2/2008 | Nakayama et al. | 428/220 |
| 2009/0179220 A1* | 7/2009 | Fukunaga et al. | 257/103 |
| 2010/0102311 A1* | 4/2010 | Ito et al. | 257/43 |
| 2010/0112094 A1 | 5/2010 | Yoshida et al. | |

\* cited by examiner

SEMICONDUCTOR LIGHT-EMITTING ELEMENT, METHOD FOR MANUFACTURING THE SEMICONDUCTOR LIGHT-EMITTING ELEMENT AND LAMP THAT USES THE SEMICONDUCTOR LIGHT-EMITTING ELEMENT

CROSS REFERENCE TO RELATED APPLICATIONS

This application claims the benefit of International Application No. PCT/JP2009/054143 filed Mar. 5, 2009, having a claim of priority to JP patent application numbers 2008-057056, filed Mar. 6, 2008, and 2008-332316, filed Dec. 26, 2008.

TECHNICAL FIELD

The present invention relates to a semiconductor light-emitting element, and particularly to a semiconductor light-emitting element that has excellent light-emitting output (Po) of ultraviolet light. Moreover, the present invention relates to a method for manufacturing the semiconductor light-emitting element, and a lamp that uses the semiconductor light-emitting element.

RELATED ART

Light-emitting diodes (LED) that use a semiconductor light-emitting element have low power consumption, long life and are compact, so are used in many electronic devices. Light-emitting diodes, which are used as light sources in various applications, comprise semiconductor light-emitting elements in combination with various kinds of transparent covers or covers having a fluorescent material such as shell-type, side-view type for portable backlights and top-view type used in indicators.

As the construction of a semiconductor light-emitting element, there is face-up type, for example, in which an n-type semiconductor layer, light-emitting layer and p-type semiconductor layer are sequentially layered on a substrate. Part of the p-type semiconductor layer, light-emitting layer and n-type semiconductor layer are etched, and together with providing a negative electrode on the n-type semiconductor layer, an electrically conductive film is formed on the p-type semiconductor layer as a positive electrode, and a bonding pad or the like is provided on the positive electrode for electrically connecting to a circuit board or a lead frame.

The compound used in forming a semiconductor layer comprising a n-type semiconductor layer, light-emitting layer and p-type semiconductor layer include gallium nitride compounds, zinc selenide compounds, gallium phosphide compounds, indium phosphide compounds, or gallium arsenide compounds.

Recently, in this kind of semiconductor light-emitting element, the positioning of gallium nitride semiconductor light-emitting elements, which function as blue light-emitting elements, is becoming more and more important. Gallium nitride semiconductor light-emitting elements are obtained by forming a gallium nitride semiconductor on a substrate selected from among a single sapphire crystal, various kinds of oxides and III-V compounds using a method such as Metal Organic Chemical Vapor Deposition (MOCVD) or Molecular Beam Epitaxy (MBE).

In a gallium nitride semiconductor light-emitting element, current diffusion is small in the transverse direction, so current only flows into the semiconductor directly below the electrode, and when the electrode is not transparent, there is a problem in that the light that is emitted by the light-emitting layer is blocked by the electrode and cannot be obtained externally. For this reason, normally, a transparent electrode is used for the positive electrode of a gallium nitride semiconductor light-emitting element in order that light that passes through the positive electrode can be obtained.

A known transparent conductive material such as Ni/Au or ITO is used for this kind of transparent electrode. Recently, an oxide compound having excellent transparency such as $In_2O_3$ or ZnO is used as the main component. Of these materials, ITO (indium tin oxide) is used the most as transparent electrode material, because by the doping of 5 to 20 mass % of $SnO_2$ to $In_2O_3$, it is possible to obtain a transparent conductive film having low resistance on the order of $2\times10^{-4}$ $\Omega \cdot$cm.

However, ITO film having low resistance is a crystalline film, and the crystalline state gradually changes due to the substrate temperature, the state of the atmospheric gas or plasma density, and there is a possibility that a crystalline film and amorphous film may be mixed on the same substrate. There are problems in that due to this mixing of films, over etching or insufficient etching such as the occurrence of etching residue may occur, and it may become difficult to make the film finer.

On the other hand, a method is being studied in which when forming ITO film at near room temperature, an amorphous ITO film is formed by adding water or hydrogen to the sputtering gas, and after etching this ITO film, the film is heated and crystallized. However, when water or hydrogen is added during film formation, problems occur in that the adherence of the film to the underneath substrate decreases, or the ITO target surface used is reduced and a large amount of nodules are generated, causing abnormal discharge such as arching.

Moreover, gallium nitride semiconductor light-emitting elements are attracting attention as light-emitting elements of ultraviolet light in the shorter-wavelength range than blue light. Various studies have been performed for transparent electrodes suitable for ultraviolet light-emitting elements, however, in ITO film, the amount of light that is absorbed into the film from the wavelength range of 400 nm or less increases, so transmittance in the wavelength range of 400 nm or less rapidly decreases. Therefore, when ITO is used for an electrode of a light-emitting element that emits light having a wavelength in the ultraviolet range, there is a problem in that the output of emitted light is low.

Therefore, using indium zinc oxide (IZO; registered trademark) instead of ITO is being studied. With this IZO, by performing a formation process at near room temperature, a nearly perfect amorphous film can be formed, so by using an oxalic acid etchant, which is a weak acid, it is possible to perform etching easily with no problem such as residue. Furthermore, in the case of an IZO target, there is little occurrence of nodules during sputtering, which is also a merit in that there is little abnormal discharge such as arcing.

In regards to this, in patent literature 1, a method is disclosed in which the transmittance of light having a wavelength in the ultraviolet range (350 nm to 420 nm) is improved using a crystallized IZO film as a transparent electrode which is obtained by forming an amorphous IZO film, performing an etching process, and then crystallizing this film.

It is disclosed that to crystallize this amorphous IZO film, an annealing process at a temperature of 500° C. to 900° C. is necessary. However, as disclosed in patent literature 2, when performing this kind of annealing process at high temperature, it was found that problems occurred in that there is element interdiffusion near the boundary between the conductive oxide film and p-type semiconductor layer, which not only impedes the reduction of the specific resistance of the conductive oxide film, but is also linked to an increase in specific resistance of a p-type semiconductor layer and an increase in contact resistance between the conductive oxide film and p-type semiconductor layer. Particularly, the gallium element in the p-type semiconductor layer diffuses into the translucent conductive oxide film, which has the effect of impeding the lowering the specific resistance and contact resistance.

On the other hand, amorphous IZO film that is not crystallized by an annealing process, has disadvantages in that the transmittance on the visible short-wavelength side with a wavelength of 400 to 450 nm, or in other words, the transmittance of blue light is low.

Patent Literature 1: JP 2007-287845 A1
Patent Literature 2: JP 2007-294578 A1
Non-patent Literature: "Transparent Conductive Film Technology (Revision 2)", Ohmsha, Ltd., Dec. 20, 2006, p. 72-79

DISCLOSURE OF THE INVENTION

Problems to be Solved by the Invention

Taking the aforementioned situation into consideration, the object of the present invention is to solve the problems described above by providing a semiconductor light-emitting element and lamp that uses the semiconductor light-emitting element that are capable of efficiently outputting blue light or ultraviolet light.

Means for Solving the Problems

One aspect of the semiconductor light-emitting element of the present invention comprises: a compound semiconductor layer that includes at least a p-type semiconductor layer; and a transparent electrode that is provided on the p-type semiconductor layer; wherein the transparent electrode is formed from a transparent conductive film comprising an oxide of indium and gallium. The oxide of indium and gallium can include unavoidable impurities in the composition thereof.

It is preferred that the amount of gallium contained in the transparent conductive film be at a Ga/(In+Ga) atomic ratio of 0.10 to 0.35.

Moreover, it is preferred that the transparent conductive film be amorphous, or in other words, not crystallized.

Another aspect of the semiconductor light-emitting element of the present invention comprises: a compound semiconductor layer that includes at least a p-type semiconductor layer; and a transparent electrode that is provided on the p-type semiconductor layer; wherein the transparent electrode is made from a transparent conductive film comprising an oxide of indium, gallium and tin; and the transparent conductive film is crystallized. The oxide of indium, gallium and tin can include unavoidable impurities in the composition thereof.

It is preferred that the amount of gallium contained in the transparent conductive film be at a Ga/(In+Ga+Sn) atomic ratio of 0.02 to 0.30; and the amount of tin contained be at a Sn/(In+Ga+Sn) atomic ratio of 0.01 to 0.11.

The present invention is preferably applied to a semiconductor light-emitting element comprising a compound semiconductor layer having a light-emitting wavelength in at least the range 350 nm to 500 nm.

Typically a gallium nitride semiconductor layer is used as a compound semiconductor layer having this kind of property.

In the present invention it is preferred that the transparent conductive film have transmittance of 85% or greater in the wavelength range near 450 nm.

Moreover, it is preferred that the transparent conductive film have transmittance of 80% or greater in the wavelength range near 400 nm.

Furthermore, it is preferred that the surface resistance of the transparent conductive film be 20Ω/□ (ohms per square) or less, and that the thickness of the transparent conductive film be 10 nm to 1000 nm.

It is preferred that a protective layer be formed on the transparent electrode.

The semiconductor light-emitting element of the present invention is preferably used in a lamp including an LED lamp.

On the other hand, when manufacturing a semiconductor light-emitting element that comprises a compound semiconductor layer that includes at least a p-type semiconductor layer, and a transparent electrode that is provided on the p-type semiconductor layer, a manufacturing method forms a transparent conductive film by forming an amorphous oxide of indium and gallium, or forming an amorphous oxide of indium, gallium and tin on the p-type semiconductor layer, and then performs an annealing process on the transparent conductive film at a temperature of 200° C. to 480° C.

In case that the transparent conductive film is formed from an amorphous oxide of indium and gallium, micro crystals are formed in the transparent conductive film by the annealing process, but the amorphous state is maintained.

On the other hand, in case that the transparent conductive film is formed from an amorphous oxide of indium, gallium and tin, the transparent conductive film is crystallized by the annealing process.

The annealing process is performed in an atmosphere that does not include oxygen, and preferably is performed in a vacuum atmosphere, a nitrogen atmosphere, or a gas mixture atmosphere of nitrogen and hydrogen.

The transparent conductive film is amorphous before performing the annealing process, so patterning can be performed easily.

It is preferred that a protective layer be layered on the transparent conductive film electrode after the annealing process.

Effect of the Invention

The semiconductor light-emitting element of the present invention uses a transparent conductive film that is formed from an oxide of indium and gallium or an oxide of indium, gallium and tin as a transparent electrode that is provided on a p-type semiconductor layer, and annealed at a relatively low temperature of 200° C. to 480° C.

The transparent conductive film has transmittance of 85% or greater in the wavelength range near 450 nm, and a transmittance of 80% or greater in a wavelength range near 400 nm. Therefore, the transparent electrode of the semiconductor element of the present invention has better light permeability in both the blue range and ultraviolet range than a conventional transparent electrode that uses IZO film. In this way, the semiconductor light-emitting element of the invention has higher output of blue and ultraviolet light than a conventional semiconductor light-emitting element, and thus can be said to have excellent light-emitting properties.

In addition, the annealing process in order to obtain this effect, is performed in a temperature range of 200° C. to 480° C., which is lower than the temperature range of 500° C. to 900° C. that is required for IZO film, so there is no hindrance of the lowering of the specific resistance and contact resistance due to the gallium element in the p-type semiconductor layer diffusing into the transparent conductive film caused by high-temperature annealing. Therefore, by using this transparent conductive film, a transparent electrode having excellent light-emitting properties of blue and ultraviolet light, as well as low resistance can be obtained.

Furthermore, at the time that the transparent conductive film is formed on the p-type semiconductor layer, the film is amorphous, so etchability is excellent, and highly precise patterning is possible.

EXPLANATION OF REFERENCE NUMBERS

1 Semiconductor light-emitting element
10, 31 Substrate
11 n-type GaN layer (n-type semiconductor layer)
12 Light-emitting layer
13 p-type GaN layer (p-type semiconductor layer)
14 Positive electrode (translucent electrode)
15 Positive electrode bonding pad
16 Negative electrode
30 Gallium nitride compound semiconductor layer
32 GaN underlayer (n-type semiconductor layer)
33 n-type GaN contact layer (n-type semiconductor layer)
34 n-type AlGaN clad layer (n-type semiconductor layer)
35 Light-emitting layer
36 p-type AlGaN clad layer (p-type semiconductor layer)
37 p-type GaN contact layer (p-type semiconductor layer)
40 Lamp
41 Frame
42 Frame
43 Wire
44 Wire
45 Molding

BEST MODE FOR CARRYING OUT THE INVENTION

As a result of dedicated study in order to solve the aforementioned problems, the inventors found that a transparent conductive film comprising an oxide of indium and gallium, or a transparent conductive film comprising an oxide of indium, gallium and tin has the characteristics of easily being able to obtain an amorphous state by low-temperature film formation at near room temperature, and thus has excellent etchability, as well as has better light permeability than IZO film in not only the ultraviolet range (350 nm to 420 nm) but also in the blue range (400 to 450 nm).

Furthermore, the inventors learned that compared with the temperature range of 500° C. to 900° C. that was necessary in the case of IZO film for performing the annealing process on transparent conductive film in order to obtain the aforementioned permeability, it was possible to perform the annealing process at a lower temperature range of 200° C. to 480° C.

In other words, for IZO film, in order to obtain sufficient permeability in the blue color range and ultraviolet range, it is necessary to perform an annealing process at high temperature as described above for amorphous IZO film. Through this high-temperature annealing process, the gallium element in the p-type semiconductor layer diffuses into the translucent conductive oxide film, which impedes lowering of the specific resistance and contact resistance. On the other hand, in the case of the transparent conductive film of the present invention, by performing the annealing process at a lower temperature, it is possible to obtain excellent light permeability in both the blue range and ultraviolet range, so it is possible to efficiently output both blue light and ultraviolet light. The semiconductor light-emitting element of the present invention comprising this kind of transparent conductive film has a high output of emitted blue and ultraviolet light.

Therefore, the inventors completed the present invention based on their knowledge that by using the aforementioned transparent conductive film as the transparent electrode (positive electrode) of a semiconductor light-emitting element, it is possible to efficiently output blue or ultraviolet light with little light having a wavelength in the blue or ultraviolet range being absorbed by the transparent electrode of the semiconductor light-emitting element, and thus a semiconductor light-emitting element having high output of emitted blue or ultraviolet light can be obtained.

The present invention can be applied to semiconductor light-emitting elements having various construction which comprise a compound semiconductor layer provided with at least a p-type semiconductor layer and a transparent electrode formed on the p-type semiconductor layer, including semiconductor light-emitting elements having a face-up structure in which a transparent electrode is formed on a compound semiconductor layer that is formed by sequentially layering an n-type semiconductor layer, light-emitting layer and p-type semiconductor layer on a substrate.

A feature of the present invention is forming a transparent electrode by using a transparent conductive film comprising an oxide of indium and gallium or an oxide of indium, gallium and tin in the place of a conventional IZO film, and by using the transparent conductive film which is subject to an annealing treatment at a temperature of 200° C. to 480° C. Hereinafter, the present invention will be explained in detail centering on this feature.

1. Transparent Electrode (Transparent Conductive Film)

Figure 1:
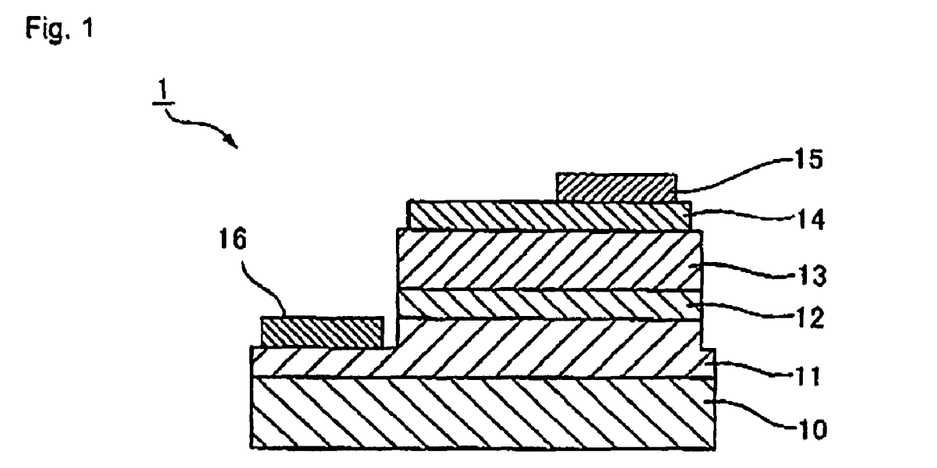
FIG. 1 is a cross-sectional view that schematically illustrates one example of a semiconductor light-emitting element of the present invention.

In the semiconductor light-emitting element of the present invention, a transparent conductive film comprising an oxide of indium and gallium, or a transparent conductive film comprising an oxide of indium, gallium and tin, is formed on a p-type semiconductor layer 13 as a transparent electrode 14 (positive electrode) (refer to FIG. 1).

More specifically, the transparent conductive film described above is formed directly on a p-type semiconductor layer 13, or formed on the p-type semiconductor layer 13 via a metallic layer. When a metallic layer is located between the transparent electrode 14 and p-type semiconductor layer 13, it is possible to reduce the driving voltage (Vf) of the semiconductor light-emitting element 1, however, on the other hand, the transmittance is reduced and the light output decreases. Therefore, whether or not to provide a metallic layer is suitably determined by balancing the driving voltage (Vf) and light output according to the use of the semiconductor light-emitting element.

Typically, one or more metal selected from among Ni, Ni oxide, Pt, Pd, Ru, Rh Re and Os is used as the metallic layer.

(Composition)

Of the transparent conductive film of the present invention, the amount of gallium contained in the indium and gallium oxide transparent conductive film is preferably within the range of a Ga/(In+Ga) atomic ratio of 0.10 to 0.35.

When this atomic ratio is less than 0.10, the specific resistance of a transparent conductive film that is formed at room temperature or low temperature is low, however, patterning by wet etching may become difficult. On the other hand, when this atomic ratio is greater than 0.35, the specific resistance of the transparent conductive film used as the transparent electrode of the semiconductor light-emitting element of the present invention becomes high. Moreover, in order to obtain excellent light-emitting characteristics for the semiconductor light-emitting element described above, annealing processing of the transparent conductive film is effective, however, the larger the amount of gallium contained, the higher the annealing temperature must be. Therefore, when the atomic ratio is greater than 0.35, it is necessary to perform annealing of the transparent conductive film at a high temperature greater than 500° C., and as a result, the surface resistance and contact resistance of the transparent electrode increases, and lowering the resistance becomes difficult.

Moreover, of the transparent conductive film of the present invention, in the case of a transparent film comprising an oxide of indium, gallium and tin, the amount of Gallium contained is preferably within the range of a Ga/(In+Ga+Sn) atomic ratio of 0.02 to 0.30, and the amount of tin contained is preferably within the range of a Sn/(In+Ga+Sn) atomic ratio of 0.01 to 0.11. The restrictions on the compositional ranges are the same as in the case of the indium and gallium oxide transparent conductive film, however, when tin is further added, the compositional range shifts toward the side of a lower amount of gallium. Furthermore, the addition of tin within the proper compositional range has a particular effect of lowering the resistance of a crystallized transparent conductive film, as well as has the effect of improving the permeability of light in the ultraviolet range.

When this atomic ratio is less than 0.01, these effects are not sufficiently obtained, and when this atomic ratio is greater than 0.11, the effect of adding a surplus amount of tin results in the effects being reduced by half.

There is also an unavoidable possibility of impurities from the raw materials of the target material that is used for creating the transparent conductive film, or impurities that are mixed in from the formation equipment that is used in the manufacturing process of the target material being included in the transparent conductive film having the composition described above.

(Film Thickness)

In order to achieve a transparent conductive film having low specific resistance and high transmittance, the film thickness of the transparent conductive film described above is preferably within the range 10 nm to 10,000 nm, and even more preferably within the range 100 nm to 1,000 nm. Furthermore, from the aspect of production cost, the film thickness of the transparent conductive film is preferably 1,000 nm or less.

(Properties)

The transparent electrode of the semiconductor light-emitting element of the present invention, after going through the annealing process described later, preferably has transmittance in the wavelength range around 450 nm of 85% or greater, and more preferably 90% or greater, and preferably has transmittance in the wavelength range around 400 nm of 80% or greater, and more preferably 85% or more. In this way, the semiconductor light-emitting element of the present invention has efficient light-emitting properties in not only the ultraviolet range (350 to 420 nm), but also in the blue range (400 to 450 nm).

Therefore, when a compound semiconductor layer has a light-emission wavelength in the range of at least 350 nm to 500 nm, it is possible to optimally use the semiconductor light-emitting element of the present invention. In other words, not only is the semiconductor light-emitting element of the present invention effective in improving the efficiency of obtaining light from a semiconductor light-emitting element having a center wavelength in the ultraviolet range (350 nm to 420 nm), but by having a light emission range of 350 nm to 420 nm, can also improve the efficiency of obtaining light even in the case of a semiconductor light emitting element for the blue color range having a central wavelength of 400 to 450 nm.

Furthermore, as will be described later, the semiconductor light-emitting element of the present invention goes through a low-temperature annealing process, so there is no problem of impeding the lowering of the surface resistance and contact resistance of the transparent conductive film; for example, it is possible to maintain the surface resistance of the transparent conductive film to 20Ω/□, so even though the transmittance of the transparent electrode itself is improved, there is no problem of the light output decreasing in the range described above of the semiconductor light-emitting element by the lowering of the resistance being impeded.

2. Construction of the Transparent Electrode (Formation of the Transparent Conductive Film)

Next, the construction of the transparent electrode, or in other words, the method of forming a transparent conductive film comprising an oxide of indium and gallium, or a transparent conductive film comprising an oxide of indium, gallium and tin on a p-type semiconductor layer will be explained.

First, a transparent conductive film comprising an oxide of indium and gallium, or a transparent conductive film comprising an oxide of indium, gallium and tin is formed in an amorphous state over the entire area of the p-type semiconductor layer.

The method for forming the transparent conductive film can be any known method that is used for forming thin film as long as it is possible to form the film in the amorphous state. For example, the film can be formed using a sputtering method or vacuum vapor deposition method, however, compared to the vacuum vapor deposition method, using a sputtering method in which few particles and little dust are generated during film formation is preferred. Moreover, when using a sputtering method, in order to form a good quality amorphous film at a high formation rate, it is preferred that the transparent conductive film be formed using a sputtering target of an oxide sintered compact of indium and gallium, or an oxide sintered compact of indium, gallium and tin, with a DC magnetron sputtering method.

In case that the target described above is an oxide sintered compact of indium and gallium, an oxide sintered compact is preferred in which the amount that gallium is contained is preferably a Ga/(In+Ga) atomic ratio that is 0.10 or greater and 0.35 or less, and in which the $In_2O_3$ phase having Bixbite type structure is the main crystal phase, in which the $GaInO_3$ phase having $\beta$-$Ga_2O_3$ type structure, or $GaInO_3$ phase and (Ga, In)$_2$O$_3$ phase is finely dispersed as crystal grain having an average grain size of 5 μm or less.

Moreover, in case that the target described above is an oxide sintered compact of indium, gallium and tin, an oxide sintered compact is preferred in which the amount that gallium is contained is preferably a Ga/(In+Ga+Sn) atomic ratio that is 0.02 to 0.30, the amount that tin is contained is preferably an atomic ration of 0.01 to 0.11, and in which the In$_2$O$_3$ phase having Bixbite type structure is the main crystal phase, in which the GaInO$_3$ phase having β-Ga$_2$O$_3$ type structure, or GaInO$_3$ phase and (Ga, In)$_2$O$_3$ phase is finely dispersed as crystal grain having an average grain size of 5 μm or less. By adding tin, much of the tin (Sn) is considered to be substituted in the gallium (Ga) site or indium (In) site of the GaInO$_3$ phase, and when the amount of Sn exceeds the solid solubility limit of the GaInO$_3$ phase, or cannot be substituted in because of a reason such as local non-uniform portions in the composition during the manufacturing process of the sintered compact, a tetragonal complex oxide phase that is expressed by the general formula: Ga$_{3-x}$In$_{5+x}$Sn$_2$O$_{16}$ (0.3<x<1.5) may be somewhat generated, however, it is preferred that this phase as well be finely dispersed as crystal grain having an average grain size of 5 μm or less.

By using this kind of target, formation of an amorphous film becomes easier. More specifically, of the transparent conductive films of the present invention, in the transparent conductive film comprising an oxide of indium and gallium, an amorphous transparent conductive film containing an amount of gallium that is within the range of a Ga/(In+Ga) atomic ratio of 0.10 to 0.35 is obtained. Moreover, in the case of a transparent conductive film comprising an oxide of indium, gallium and tin, an amorphous transparent conductive film containing an amount of gallium within the range of a Ga/(In+Ga+Sn) atomic ratio of 0.02 to 0.30, and containing an amount of tin within the range of a Sn/(In+Ga+Sn) atomic ratio of 0.01 to 0.11 is obtained.

Furthermore, when this kind of target is used, hardly any nodules are generated. In order to reduce the damage due to plasma in the p-type semiconductor layer, the sputtering discharge output is preferably 1,000 W or less.

After film formation, the transparent conductive film of the present invention is amorphous. The crystallization temperature of the film is 220° C. or greater, which is sufficiently higher than the approximate 190° C. of typical ITO, so the film is completely amorphous with no micro crystals.
(Patterning)

The amorphous transparent conductive film that is formed in this way is patterned except for the positive electrode formation area, which is the area where the transparent electrode will be formed on the p-type semiconductor layer, by using a known photolithography method and etching, so that on the positive electrode formation area is formed.

Patterning of the transparent conductive film is preferably performed before performing the annealing process described later. The transparent conductive film before the annealing process is amorphous, so by using a known etching solution that includes oxalic acid, which is a weak acid, the film can be easily etched with good precision without a problem of residue. Etching of the transparent conductive film could also be performed using dry etching equipment.
(Annealing)

In the present invention, after patterning the transparent conductive film comprising an oxide of indium and gallium, or the transparent conductive film comprising an oxide of indium, gallium and tin, an annealing process is performed at a temperature within the range 200° C. to 480° C.

In this kind of low-temperature annealing process, in the transparent conductive film comprising an oxide of indium and gallium, a suitable temperature is selected within the temperature range described above according the amount of gallium, and it is necessary to perform control so that the amorphous state of the film is maintained without crystallizing. It is not possible to observe inside this amorphous transparent conductive film with X-ray diffraction, however, a state occurs in which micro crystals (very fine single crystals) can be confirmed though microscopic observation of the film surface by an Atomic Force Microscope (AFM). These micro crystals are only from the indium oxide phase containing solute gallium, and take the form of being partially crystallized in the amorphous film. By limiting the annealing process to the temperature at which micro crystals are generated, carrier electrons increase due to oxygen deficiency, as well as simple defects that are generated during film formation at low energy near room temperature and that do not contribute to the generation of carrier electrons are dissolved, which is considered to contribute to the generation of new carrier electrons (or improve mobility), making it possible to sufficiently obtain the effect of low specific resistance.

By limiting micro crystals in the transparent conductive film to an amount that is not observable by X-ray diffraction, it is possible to improve the transmittance of light not only in the blue range (400 nm to 450 nm), but also at wavelengths in the ultraviolet range (350 nm to 420 nm), as well as it is possible to improve contact with the p-type semiconductor layer. Completely crystallizing the transparent conductive film is not preferable. That is because when the film is completely crystallized, there are restrictions due to the crystal lattice, so carrier electrons decrease without allowing generation of as much oxygen deficiency as in the amorphous state, and thus there is an increase in specific resistance. In addition, when there is a decrease in carrier electrons, the apparent band gap becomes small, and the transmittance becomes low.

On the other hand, in the case of the transparent conductive film comprising an oxide of indium, gallium and tin, maintaining the amorphous state in this low-temperature annealing process is suitable, however, crystallizing the amorphous transparent conductive film is more preferable. Through this crystallization, it is possible to similarly improve the light transmittance for wavelengths in not only the blue range (400 nm to 450 nm), but also in the ultraviolet range (350 nm to 420 nm). The crystallized transparent conductive film is formed of just the indium oxide phase containing solute gallium. The sintered compact is basically formed from the In$_2$O$_3$ phase and GaInO$_3$ phase, and in some cases may further include a tetragonal complex oxide phase that is expressed by the general formula: Ga$_{3-x}$In$_{5+x}$Sn$_2$O$_{16}$ (0.3<x<1.5). On the other hand, in the obtained thin film, neither the GaInO$_3$ phase nor Ga$_{3-x}$In$_{5+x}$Sn$_2$O$_{16}$ (0.3<x<1.5) phase is formed. The reason for this is that very high energy is necessary for forming the above two phases, and in the thin film, the solid solubility limit of gallium into the indium oxide phase becomes much larger than that of the sintered compact.

The improvement of light transmittance at wavelengths in the ultraviolet range by crystallization such as described above is explained by the effect of the significant increase in carrier electrons in the crystal film to which tin is added. In other words, the indium oxide phase is formed by crystallization, however, when tin is added, carrier electrons are further generated by tetravalent tin being substituted into the sites of trivalent indium (or gallium). When carrier electrons are generated by site substitution of tin in this way, the carrier electron density, including the carrier electrons that are generated by oxygen deficiency, increases to about $10^{21}$ cm$^{-3}$.

Through this kind of increase in carrier electron density, part of the carrier electrons occupies the bottom region of the conduction band, and the apparent band gap becomes larger than normal. As disclosed in non-patent literature 1, this kind of phenomenon is called Burstein-Moss (BM) shift. From this Burstein-Moss shift, the energy required for optical transition becomes large, and that is, more ultraviolet light can be transmitted.

Therefore, by generating micro crystals to an extent that the micro crystals cannot be observed by X-ray diffraction while maintaining the amorphous state of the transparent conductive film, or by crystallizing the transparent conductive film, through this low-temperature annealing process, it is estimated that the mechanism for increasing transmittance in the ultraviolet range is due to the increase in the band gap of the transparent conductive film.

The reason for making the temperature of the annealing process of the transparent conductive film 200° C. to 480° C., is that when the annealing process is performed at a temperature less than 200° C., there is a possibility that it will not be possible to generate micro crystals in the transparent conductive film, or it may not be possible to sufficiently crystallize the transparent conductive film, and thus there is a possibility that light transmittance in the ultraviolet range of the transparent conductive film may not be able to be made sufficiently high. On the other hand, when the annealing process is performed at a temperature greater than 480° C., a problem occurs in that the gallium element in the p-type semiconductor layer will diffuse into the transparent conductive film, which prevents the lowering of the specific resistance and contact resistance.

In patent literature 2, performing an annealing process of a transparent conductive film such as ITO, AZO, IZO, GZO and the like is disclosed in which the annealing process is a laser annealing and the annealing process is preformed at a temperature of 200° C. to 300° C., where the upper limit temperature of the annealing process is set lower than the present invention. This is because the amount of gallium contained in the transparent conductive film presented in patent literature 2 is low. The amount of gallium contained in the transparent conductive film of the present invention is relatively large, and because the driving force for the diffusion of gallium into the p-type semiconductor layer becomes low, it is estimated that no problems will occur even at a higher temperature.

The annealing process of the transparent conductive film described above is preferably performed in an atmosphere that does not include oxygen, where a vacuum atmosphere, an inert gas atmosphere such as a nitrogen atmosphere, or a mixed gas atmosphere of hydrogen and an inert gas such as nitrogen could be used as an atmosphere that does not include oxygen.

When the annealing process of the transparent conductive film described above is performed in a vacuum atmosphere, a nitrogen atmosphere, or a mixed gas atmosphere of nitrogen and hydrogen, it is possible to effectively reduce the generation of micro crystals in the transparent conductive film or crystallization of the transparent conductive film, as well as the sheet resistance of the transparent conductive film. Particularly in the case where it is desired to reduce the sheet resistance of the transparent conductive film, the annealing process should be performed in a mixed gas atmosphere of nitrogen and hydrogen. The ratio of nitrogen and hydrogen in the mixed gas atmosphere can be arbitrarily selected from a range of 100:1 to 1:100 that is suitable to the amount of oxygen contained in the formed amorphous film.

On the other hand, when the annealing process is performed in an atmosphere including oxygen at a high temperature of 300° C. or greater, the surface resistance of the transparent conductive film increases. It is possible that the reason that the surface resistance of the transparent conductive film increases when the annealing process is performed in an atmosphere that includes oxygen is that the oxygen vacancy in the transparent conductive film decreases. The reason that the transparent conductive film is conductive is that the existence of oxygen vacancy in the transparent conductive film causes electrons to be generated that will become carriers. Therefore, it is thought that by performing the annealing process in an atmosphere that includes oxygen, the oxygen vacancy, which is the source for generating carrier electrons, is reduced, so the carrier density of the transparent conductive film decreases and the surface resistance becomes high.

In the case of selecting an inert gas atmosphere such as a nitrogen atmosphere as an atmosphere that does not include oxygen in which to perform the annealing process, when by chance there is residual oxygen, the surface resistance will increase as described above. In order to avoid this, a method of bringing the inside of the furnace used for the annealing process to a vacuum condition of 10 Pa or less, and then introducing highly pure nitrogen having a purity of 4N flow into the furnace is effective. A method in which hydrogen gas is added to the nitrogen gas to form a mixed gas atmosphere is also preferred. The reduction effect due to hydrogen gas can be expected, and it is effective not only when creating a vacuum inside the furnace used for the annealing process but even when vacuuming is not performed.

Various methods could be used as the annealing process for generating micro crystal in the transparent conductive film, or for crystallizing the transparent conductive film; for example, the annealing process could be a method that uses an RTA annealing furnace, a method of performing laser annealing or a method of performing electron beam irradiation.

After being crystallized by the annealing process, the transparent conductive film adheres better with a p-type semiconductor layer or a positive electrode bonding pad that is described later than an amorphous film, so the film has the advantage of being able to prevent a decrease in yield due to pealing during the manufacturing process of the semiconductor light-emitting element. Moreover, the crystallized transparent conductive film reacts little with moisture in the air, so the film also has the advantage of there being little degradation of characteristics during durability testing over a long period of time.

3. Construction of a Semiconductor Light-Emitting Element

As described above, the construction of the semiconductor light-emitting element of the present invention is typically applied to a semiconductor light-emitting element having construction in which a transparent electrode 14 is formed on a p-type semiconductor layer 13, construction is not limited to this. In other words, the present invention can be widely applied to known semiconductor light-emitting elements having the construction described above. However, in order to understand the present invention, the typical construction of the semiconductor light-emitting element to which the present invention is applied is concisely described.

(Substrate)

It is possible to use without restrictions known substrate material such as single crystal oxide material like single crystal sapphire ($Al_2O_3$; A-plane, C-plane, M-plane, R-plane), single crystal spinel ($MgAl_2O_4$), single crystal ZnO, single crystal $LiAlO_2$, and single crystal $LiGaO_2$, single crystal Si, single crystal SiC, single crystal GaAs, single crystal AlN, single crystal GaN and single crystal boride material like $ZrB_2$ for the substrate 10.

The plane orientation of the substrate is not particularly limited. Moreover, the substrate could be a just substrate, or could be a substrate having an off-angle.

(Compound Semiconductor Layer)

Preferably a gallium nitride semiconductor layer, a zinc selenide semiconductor layer, a gallium phosphide semiconductor layer, an indium phosphide semiconductor layer, or a gallium arsenide semiconductor layer is used as the compound semiconductor layer, and particularly a gallium nitride semiconductor layer is preferred.

Figure 3:
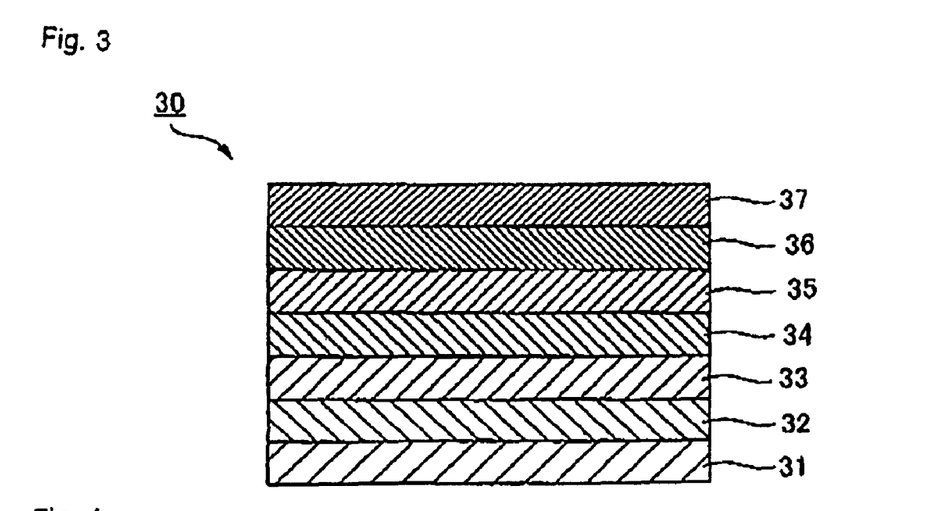
FIG. 3 is a cross-sectional view that schematically illustrates one example of a gallium nitride semiconductor layer.

For example, in face-up construction, a gallium nitride semiconductor layer is formed by sequentially layering an n-type GaN layer, light-emitting layer, and p-type GaN layer on a substrate. More specifically, a gallium nitride semiconductor layer 30 is formed by layering an AlN buffer layer, GaN under layer 32 (n-type semiconductor layer), n-type GaN contact layer 33 (n-type semiconductor layer), n-type AlGaN clad layer 34 (n-type semiconductor layer), InGaN light-emitting layer 35, p-type AlGaN clad layer 36 (p-type semiconductor layer) and p-type GaN contact layer 37 (p-type semiconductor layer) on a substrate 31 (see FIG. 3). However, various construction is known for a gallium nitride semiconductor layer, and it possible to use these without restriction.

Particularly, a p-type semiconductor layer having a typical carrier density can be used, even in the case a material having a relatively low carrier density, for example a p-type GaN layer having a carrier density of $1 \times 10^{17}$ cm$^{-3}$, the transparent conductive film comprising an oxide of indium and gallium, or the transparent film comprising an oxide of indium, gallium and tin of the present invention is suitable as a transparent electrode.

Semiconductors having various compositions that are expressed by the general formula: $Al_xIn_yGa_{1-x-y}N$ ($0 \leq x < 1$, $0 \leq y < 1$, $0 \leq x+y < 1$) are well-known as a gallium nitride semiconductor, and various semiconductors having these compositions can be used without restriction as the compound semiconductor layer of the present invention.

The method for growing these gallium nitride semiconductors is not particularly limited, and it is possible to use all known methods for growing a group-III nitride semiconductor, such as MOCVD (metal organic chemical vapor deposition), HVPE (hydride vapor phase epitaxy) or MBE (molecular beam epitaxy). From the aspect of controlling the film thickness, and mass production of film, the MOCVD method is preferred.

In the MOCVD method, hydrogen or nitrogen is used as the carrier gas, trimethylgallium (TMG) or triethylgallium (TEG) is used as the GA source, which is the group-III raw material, trimethylaluminum (TMA) or triethylaluminum (TEA) is used as the Al source, trimethylindium (TMI) or triethylindium (TEI) is used as the In source, and ammonia ($NH_3$), hydrazine ($N_2H_4$) or the like is used as the N source, which is a V-group raw material. In addition, as an n-type dopant, monosilane ($SiH_4$) or disilane ($Si_2H_6$) is used as Si raw material, and germane gas ($GeH_4$) is used as Ge raw material, and as a p-type dopant, bis(cyclopentadienyl)magnesium ($Cp_2Mg$), or bis(ethylcyclopnetadienyl)magnesium (($EtCp)_2Mg$) for example is used as the Mg raw material.

The present invention is not limited to the gallium nitride semiconductor layer described above, and as long as the compound layer has a light-emitting wavelength, any compound semiconductor layer can be applied to a light-emitting semiconductor element.

(Negative Electrode)

Figure 2:
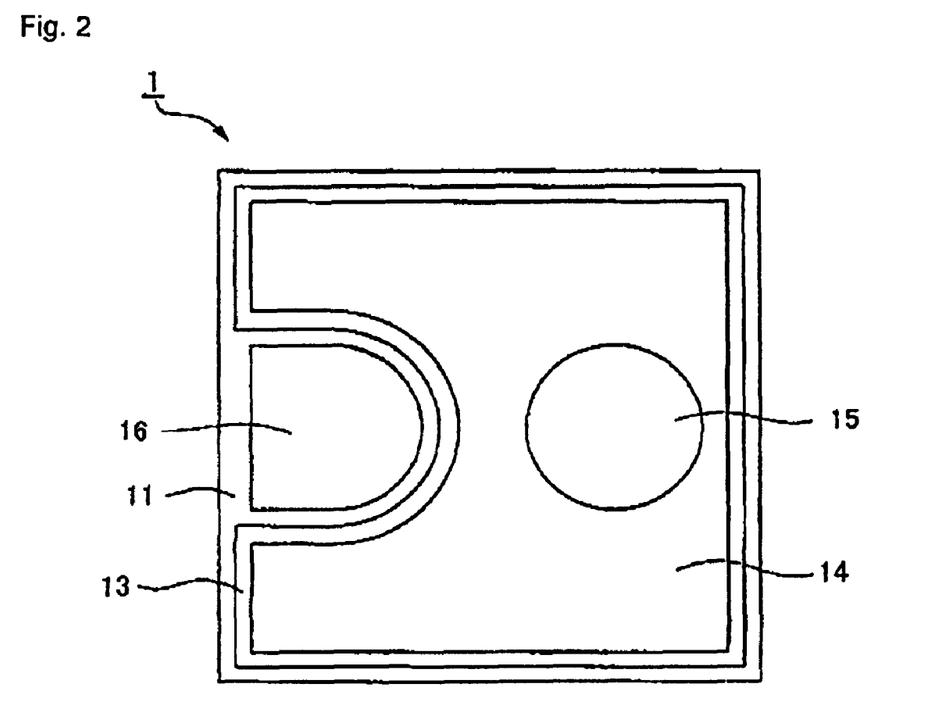
FIG. 2 is a top view that schematically illustrates the semiconductor light-emitting element illustrated in FIG. 1.

The negative electrode 16 is provided on the n-type semiconductor layer 11 that is exposed by etching and removing part of the p-type semiconductor layer 13, light-emitting layer 12 and n-type semiconductor layer 11 after formation, or after formation and annealing of the transparent conductive film described above (see FIG. 1 and FIG. 2). Various compositions and constructions such as material comprising Ti/Au are known, for example as a negative electrode, and it is possible to use a known negative electrode without restriction.

(Positive Electrode Bonding Pad)

A positive electrode bonding pad for electrically connecting with a circuit board or lead frame is provided on part of the transparent conductive film layer that is the positive electrode. Various constructions that use materials such as Au, Al, Ni and Cu are known as material for a positive electrode bonding, and these known materials and constructions can be used without restriction. In addition, the thickness of the positive electrode bonding pad is preferably within the range 100 to 1000 nm. Moreover, depending on the characteristics of the positive electrode bonding pad, the ability to bond becomes high when the thickness is large, so the thickness of the positive electrode bonding pad is more preferably 300 nm or greater. Furthermore, from the aspect of manufacturing cost, it is preferable that the thickness be 500 nm or less.

(Protective Layer)

In order to prevent oxidation of the transparent electrode (positive electrode) comprising the transparent conductive film described above, a protective layer should further be formed such that the layer covers the entire area of the transparent conductive film except the area where the positive electrode bonding pad is formed.

The protective layer is preferably formed using a material having excellent translucency, and in order to prevent current leakage between the p-type semiconductor layer and n-type semiconductor layer from occurring, is preferably formed using a material having insulating properties. As the construction material of the protective layer, it is preferred to adopt $SiO_2$, $Al_2O_3$ and the like, for example. The film thickness of the protective layer should be a film thickness capable of preventing oxidation of the transparent conductive film, as well as have excellent translucency; more specifically for example, the film thickness should be 2 nm to 500 nm.

(Lamp Using the Semiconductor Light-emitting Element)

With the semiconductor light-emitting element of the present invention, one skilled in the art can provide a transparent cover and construct a lamp by using known methods. In addition, by combining the semiconductor light-emitting element of the present invention with a cover having a fluorescent substance, it is possible to construct a white color lamp.

Moreover, with the semiconductor light-emitting element of the present invention, it is possible to construct an LED lamp without restrictions using conventional known methods. The lamp could be used for various applications such as a general-use shell type, side-view type for use in backlighting of a cell phone, top-view type using in indicators, and the like.

Figure 4:
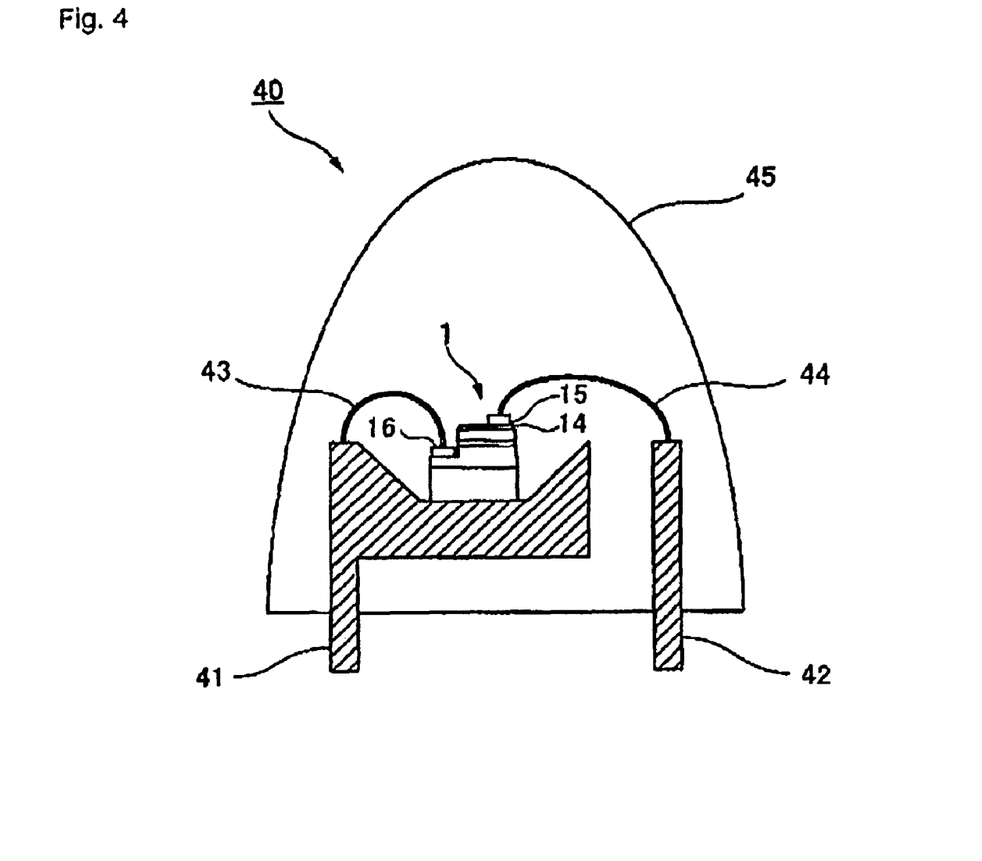
FIG. 4 is a cross-sectional view that schematically explains a lamp that is constructed using the semiconductor light-emitting element of the present invention.

FIG. 4 is a diagram illustrating the basic construction in order to explain one example of a lamp of the present invention, where the lamp 40 is such that a face-up type semiconductor light-emitting element of the invention is mounted in a shell type lamp cover. In this lamp 40, the semiconductor light-emitting element 1 illustrated in FIG. 1 is attached to one of the frames 41, 42 by resin or the like, and a positive electrode bonding pad 15 and negative electrode 16 are connected to the respective frame 41, 42 by metal wire 43, 44. In addition, transparent resin molding 45 is formed around the semiconductor light-emitting element 1.

EXAMPLES

The present invention will be explained in detail below based on examples of the invention, however the present invention is no way limited to these examples.

Example 1

Manufacturing a Gallium Nitride Semiconductor Layer

A gallium nitride semiconductor layer was manufactured as described below.

That is, an undoped GaN under layer (layer thickness 2000 nm), Si doped n-type GaN contact layer (layer thickness 2000 nm, carrier density=$1 \times 10^{19}$ cm$^{-3}$), Si doped n-type $Al_{0.07}Ga_{0.93}N$ clad layer (layer thickness 12.5 nm, carrier density=$1 \times 10^{18}$ cm$^{-3}$), a multiple quantum structure comprising six Si doped GAN barrier layers (layer thickness 14.0 nm, carrier density=$1 \times 10^{18}$ cm$^{-3}$) and five undoped $In_{0.20}Ga_{0.80}N$ well layers (layer thickness 2.5 nm), Mg doped p-type $Al_{0.07}Ga_{0.93}N$ clad layer (layer thickness 10 nm), and Mg doped p-type GaN contact layer (layer thickness 100 nm) were sequentially layered on a sapphire c-plane ((0001) crystal plane) substrate via an AlN buffer layer. Each of the layers of the layered structure of the gallium nitride semiconductor layer described was grown by reduced pressure MOCVD.

(Manufacturing the Semiconductor Light-Emitting Element)

Next, using the gallium nitride semiconductor layer that was obtained, a gallium nitride semiconductor light-emitting element was manufactured. First, using HF and HCl, the surface of the p-type GaN contact layer of the gallium nitride semiconductor layer was washed, and then a transparent conductive film comprising an oxide of indium and gallium and having a film thickness of 220 nm was formed on the p-type GaN contact layer by DC magnetron sputtering.

An oxide sintered compact target that contained gallium at a Ga/(In+Ga) atomic ratio of 0.15 was used in the sputtering of the transparent conductive film. Moreover, the sputtering film formation was performed by introducing a gas mixture of 75 sccm Ar gas and 25 sccm Ar-10% $O_2$ gas, adjusting the gas to a pressure of 0.3 Pa, and performing sputtering with the substrate temperature at room temperature.

For the transparent conductive film (hereafter referred to as "GIO15") comprising an oxide of indium and gallium that was formed by the method described above, the transmittance was measured using an ultraviolet-visible light spectroscope (V-570, JASCO Corporation). The value of the transmittance was calculated by measuring the transmittance of just the glass substrate, and then subtracting the obtained light transmission blank value. The transmittance of the amorphous GIO15 film was 90% or greater in the wavelength range near 450 nm, and was 75% or greater in the wavelength range near 400 nm. The sheet resistance, which was measure using a LORESTA-EP MCP-T360, Mitsubishi Chemical Corporation), was 24Ω/□. Moreover, the GIO15 film, immediately after being formed by the method described above, was measured by X-ray diffraction (XRD) and found to be amorphous.

After that, the amorphous GIO15 film was patterned by using photolithography and wet etching by a weak acid main consisting of oxalic acid, so that GIO15 film was only formed in the positive electrode formation area on the p-type GaN contact layer. Etching of the amorphous GIO15 film was performed at an etching rate of 40 nm/min.

After the GIO15 film was patterned, an RTA annealing furnace was used to perform annealing for 1 min at 250° C. in an atmosphere of nitrogen gas.

After annealing, the GIO15 film was measured using the same measurements as performed before annealing and was found to have high translucency in the wavelength range near 450 nm, and the transmittance in the wavelength range of 450 nm was 90% or greater. Furthermore, translucency was also improved in the wavelength range near 400 nm, and the transmittance in the wavelength range of 400 nm was 80% or greater.

Figure 5:
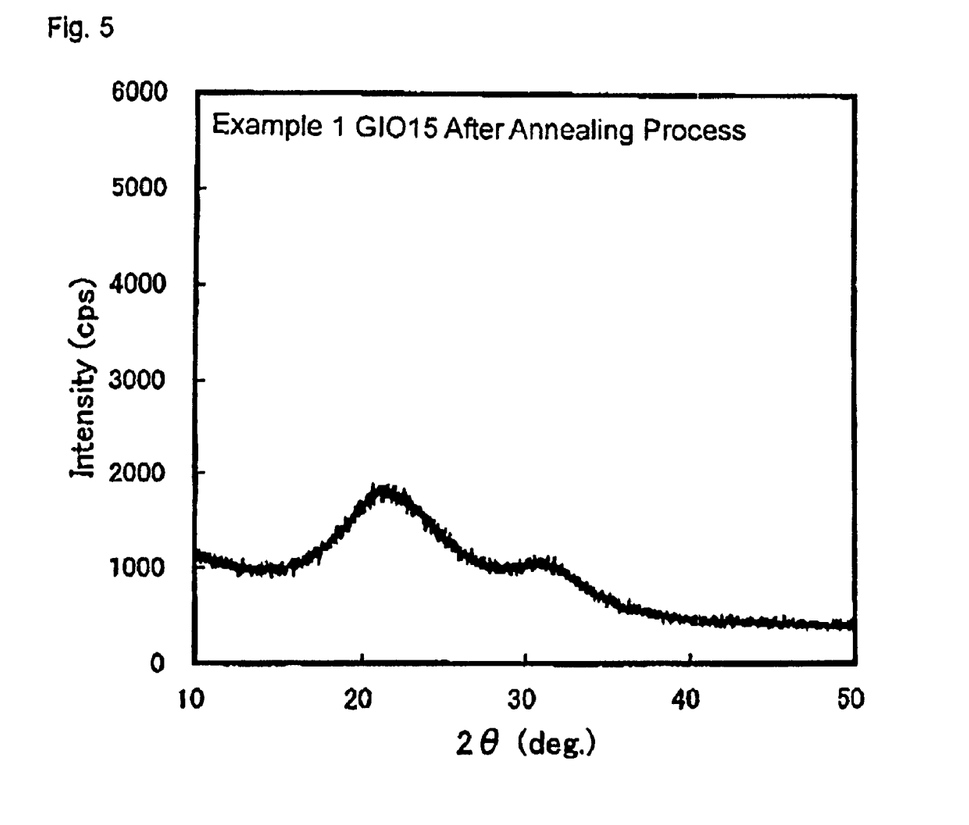
FIG. 5 is an X-ray diffraction diagram of a transparent conductive film after an annealing process of a first example.

In addition, the sheet resistance of the GIO15 film was 18Ω/□. The GIO15 film after annealing was also measured by X-ray diffraction (XRD). FIG. 5 is a graph illustrating the results of X-ray diffraction (XRD) of the GIO15 film after annealing, where the horizontal axis is a diffraction angle (2θ(°)), and the vertical axis indicates the diffraction strength (cps). As a result, as illustrated in FIG. 5, in the XRD measurement after annealing as well, the GIO15 film was found to be amorphous. By observing the film surface using an atomic force microscope (AFM, Nanoscope III, Digital Instruments), it was found that micro crystals were formed by the annealing process.

Next, dry etching was performed in the area where the n-type electrode is formed, and only in that area was the surface of the Si doped n-type GaN contact area exposed. After that, a Cr first layer (layer thickness 40 nm), a Ti second layer (layer thickness 100 nm) and an Au third layer (layer thickness 400 nm) were sequentially layered on part of the GIO15 film layer (positive electrode) and on the Si doped n-type GaN contact layer by the vacuum deposition method, to form both the positive electrode bonding pad and negative electrode. After the positive bonding pad and negative electrode were formed, the rear surface of the sapphire substrate was polished using abrasive grain such as fine diamond grain and finally finished to a mirror surface. After that, the laminated structure was cut to separate into individual 350 μm square chips, and the semiconductor light-emitting element was obtained.

(Measurement of the Driving Voltage (Vf) and Light Emission Output (Po))

The semiconductor light-emitting element (chip) that was obtained in this way was placed on a lead frame and connected to the lead frame by metal (Au) wires. In addition, the forward voltage (driving voltage: Vf) when the current applied to the semiconductor light-emitting element was 20 mA was measured using the power distribution through a probe needle. Moreover, the light emission output (Po) and light emission wavelength was measured using a typical integrating sphere.

For the light emission distribution on the light-emitting surface, it was found that light was emitted over the entire surface of the positive electrode. Furthermore, the semiconductor light-emitting element had a light emission wavelength in the wavelength range near 460 nm, Vf was 3.2 V, and Po was 12 mW, where were good values.

Example 2

The same semiconductor light-emitting element as in example 1 was manufactured except that the transparent conductive film that is formed on the p-type GaN contact layer of the gallium nitride semiconductor layer was changed to a transparent conductive film comprising an oxide of indium, gallium and tin, the annealing temperature after patterning of the transparent conductive film was 400° C., and after creating a vacuum of 1 Pa or less inside the furnace before the annealing process, highly pure nitrogen gas having a purity of 4N was introduced into the furnace.

Here, in the sputtering of the transparent conductive film, an oxide sintered compact target was used in which gallium was contained at an amount of a Ga/(In+Ga+Sn) atomic ratio of 0.15, and tin was contained at an amount of a Sn/(In+Ga+Sn) atomic ratio of 0.05.

The transparent conductive film (hereafter referred to as "GITO15") comprising an oxide of indium, gallium and tin and formed by the method described above, had relatively high transmittance of 85% or greater in the wavelength range of 450 nm and 75% or greater in the wavelength range near 400 nm before the annealing process, however the surface resistance was a little high at 30Ω/□. Moreover, the GITO15 film immediately after film formation by the method described above was found to be amorphous by measuring using the X-ray diffraction (XRD) method.

Figure 6:
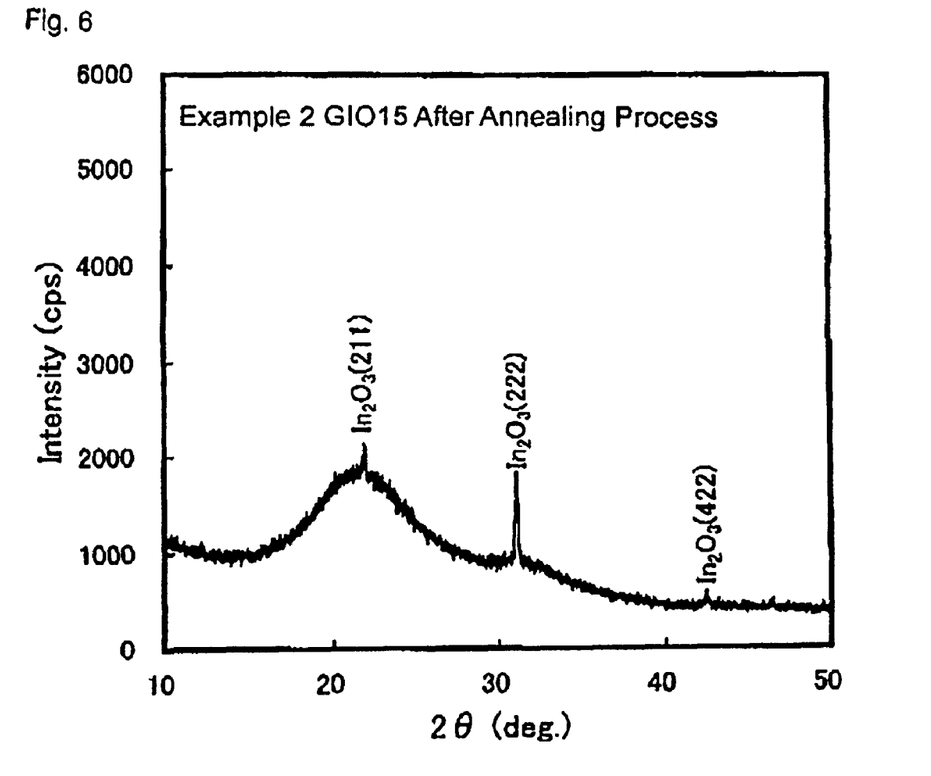
FIG. 6 is an X-ray diffraction diagram of a transparent conductive film after an annealing process of a second example.

On the other hand, immediately after the annealing process, the GITO15 film had high transmittance of 90% or greater in the wavelength range of 450 nm and 85% or greater in the wavelength range near 400 nm, and furthermore the surface resistance was a low 15Ω/□. In addition, as illustrated in FIG. 6, as a result of XRD measurement after the annealing process, a diffraction peak due to the $In_2O_3$ phase was recognized, and it was found that the GITO15 film was crystallized.

Moreover, the obtained semiconductor light-emitting element had a light emission wavelength in the wavelength range near 400 nm, Vf was 3.25 V, and Po was 13 mW, which were good values.

Example 3

The same semiconductor light-emitting element as in example 1 was manufactured except that the transparent conductive film that is formed on the p-type GaN contact layer of the gallium nitride semiconductor layer was changed to a transparent conductive film comprising an oxide of indium, gallium and tin, the atmosphere of the annealing process after patterning of the semiconductor conductive film was a vacuum, and the annealing temperature was 400° C.

Here, in the sputtering of the transparent conductive film, an oxide sintered compact target was used in which gallium was contained at an amount of a Ga/(In+Ga+Sn) atomic ratio of 0.05, and tin was contained at an amount of a Sn/(In+Ga+Sn) atomic ratio of 0.09.

The transparent conductive film (hereafter referred to as "GITO5") comprising an oxide of indium, gallium and tin and formed by the method described above, had relatively high transmittance of 85% or greater in the wavelength range of 450 nm and 75% or greater in the wavelength range near 400 nm before the annealing process, however the surface resistance was a little high at 25Ω/□. Moreover, the GITO15 film immediately after film formation by the method described above was found to be amorphous by measuring using the X-ray diffraction (XRD) method.

On the other hand, immediately after the annealing process, the GITO5 film had high transmittance of 90% or greater in the wavelength range of 450 nm and 90% or greater in the wavelength range near 400 nm, and furthermore the surface resistance was a low 10Ω/□. In addition, as a result of XRD measurement after the annealing process, a diffraction peak due to the $In_2O_3$ phase was recognized, and it was found that the GITO5 film was crystallized.

Moreover, the obtained semiconductor light-emitting element had a light emission wavelength in the wavelength range near 400 nm, Vf was 3.2 V, and Po was 16 mW, which were very good values.

Example 4

The same semiconductor light-emitting element as in example 3 was manufactured except that a gas mixture of nitrogen and hydrogen were used as the gas in the annealing process, and the annealing temperature was 450° C. Immediately after the annealing process, the GITO5 film had transmittance of 90% or greater in the wavelength range of 450 nm and 90% or greater in the wavelength range near 400 nm, and the surface resistance was 7Ω/□. In addition, similar to example 3, as a result of XRD measurement after the annealing process it was found that the GITO5 film was crystallized. Moreover, the obtained semiconductor light-emitting element had a light emission wavelength in the wavelength range near 400 nm, Vf was 3.15 V, and Po was 17 mW, which were very good values.

Example 5

The same semiconductor light-emitting element as in example 1 was manufactured except that in the sputtering of the transparent conductive film, an oxide sintered compact target was used in which gallium was contained at an amount of a Ga/(In+Ga) atomic ratio of 0.10, and in the annealing process after patterning of the transparent conductive film the annealing temperature was 220° C.

The transparent conductive film (hereafter referred to as "GIO10") comprising an oxide of indium and gallium formed by the method described above, had relatively high transmittance of 90% or greater in the wavelength range of 450 nm and 75% or greater in the wavelength range near 400 nm before the annealing process, and the surface resistance was 20Ω/□. Moreover, the GIO10 film immediately after film formation by the method described above was found to be amorphous by measuring using the X-ray diffraction (XRD) method.

Immediately after the annealing process, the GIO10 film had high transmittance of 90% or greater in the wavelength range of 450 nm and 80% or greater in the wavelength range near 400 nm, and furthermore the surface resistance was a low 16Ω/□. In addition, as a result of XRD measurement after the annealing process, a diffraction peak was not recognized, and it was found that the GIO10 film was amorphous.

Moreover, the obtained semiconductor light-emitting element had a light emission wavelength in the wavelength range near 400 nm, Vf was 3.2 V, and Po was 13 mW, which were good values.

Example 6

The same semiconductor light-emitting element as in example 1 was manufactured except that in the sputtering of the transparent conductive film, an oxide sintered compact target was used in which gallium was contained at an amount of a Ga/(In+Ga) atomic ratio of 0.20, and in the annealing process after patterning of the transparent conductive film the annealing temperature was 300° C.

The transparent conductive film (hereafter referred to as "GIO20") comprising an indium and gallium formed by the method described above, had relatively high transmittance of 90% or greater in the wavelength range of 450 nm and 80% or greater in the wavelength range near 400 nm before the annealing process, and the surface resistance was 29Ω/□. Moreover, the GIO20 film immediately after film formation by the method described above was found to be amorphous by measurement using the X-ray diffraction (XRD) method.

Immediately after the annealing process, the GIO20 film had high transmittance of 90% or greater in the wavelength range of 450 nm and 85% or greater in the wavelength range near 400 nm, and furthermore the surface resistance was a low 19Ω/□. In addition, as a result of XRD measurement after the annealing process, a diffraction peak was not recognized, and it was found that the GIO20 film was amorphous.

Moreover, the obtained semiconductor light-emitting element had a light emission wavelength in the wavelength range near 400 nm, Vf was 3.25 V, and Po was 12 mW, which were good values.

Example 7

The same semiconductor light-emitting element as in example 1 was manufactured except that in the sputtering of the transparent conductive film, an oxide sintered compact target was used in which gallium was contained at an amount of a Ga/(In+Ga) atomic ratio of 0.35, and in the annealing process after patterning of the transparent conductive film the annealing temperature was 450° C.

The transparent conductive film (hereafter referred to as "GIO35") comprising an oxide of indium and gallium formed by the method described above, had relatively high transmittance of 90% or greater in the wavelength range of 450 nm and 80% or greater in the wavelength range near 400 nm before the annealing process, and the surface resistance was 39Ω/□. Moreover, the GIO35 film immediately after film formation by the method described above was found to be amorphous by measurement using the X-ray diffraction (XRD) method.

Immediately after the annealing process, the GIO35 film had high transmittance of 90% or greater in the wavelength range of 450 nm and 85% or greater in the wavelength range near 400 nm, and furthermore the surface resistance was a low 20Ω/□. In addition, as a result of XRD measurement after the annealing process, a diffraction peak was not recognized, and it was found that the GIO35 film was amorphous.

Moreover, the obtained semiconductor light-emitting element had a light emission wavelength in the wavelength range near 400 nm, Vf was 3.25 V, and Po was 12 mW, which were good values.

Example 8

The same semiconductor light-emitting element as in example 1 was manufactured except that the transparent conductive film that is formed on the p-type GaN contact layer of the gallium nitride semiconductor layer was changed to a transparent conductive film comprising an oxide of indium, gallium and tin, and the annealing temperature after patterning of the transparent conductive film was 300° C.

Here, in the sputtering of the transparent conductive film, an oxide sintered compact target was used in which gallium was contained at an amount of a Ga/(In+Ga+Sn) atomic ratio of 0.02, and tin was contained at an amount of a Sn/(In+Ga+Sn) atomic ratio of 0.11.

The transparent conductive film (hereafter referred to as "GITO2") comprising an oxide of indium, gallium and tin and formed by the method described above, had relatively high transmittance of 85% or greater in the wavelength range of 450 nm and 75% or greater in the wavelength range near 400 nm before the annealing process, and the surface resistance was 24Ω/□. Moreover, the GITO2 film immediately after film formation by the method described above was found to be amorphous by measurement using the X-ray diffraction (XRD) method.

Immediately after the annealing process, the GITO2 film had high transmittance of 90% or greater in the wavelength range of 450 nm and 90% or greater in the wavelength range near 400 nm, and furthermore the surface resistance was a low 9Ω/□. In addition, as a result of XRD measurement after the annealing process, a diffraction peak due to the $In_2O_3$ phase was recognized, and it was found that the GITO2 film was crystallized.

Moreover, the obtained semiconductor light-emitting element had a light emission wavelength in the wavelength range near 400 nm, Vf was 3.2 V, and Po was 16 mW, which were good values.

Example 9

The same semiconductor light-emitting element as in example 1 was manufactured except that the transparent conductive film that is formed on the p-type GaN contact layer of the gallium nitride semiconductor layer was changed to a transparent conductive film comprising an oxide of indium, gallium and tin, and the annealing temperature after patterning of the transparent conductive film was 480° C.

Here, in the sputtering of the transparent conductive film, an oxide sintered compact target was used in which gallium was contained at an amount of a Ga/(In+Ga+Sn) atomic ratio of 0.30, and tin was contained at an amount of a Sn/(In+Ga+Sn) atomic ratio of 0.01.

The oxide transparent conductive film (hereafter referred to as "GITO30") comprising Indium, Gallium and Tin and formed by the method described above, had relatively high transmittance of 90% or greater in the wavelength range of 450 nm and 85% or greater in the wavelength range near 400 nm before the annealing process, and the surface resistance was 36Ω/□. Moreover, the GITO30 film immediately after film formation by the method described above was found to be amorphous by measurement using the X-ray diffraction (XRD) method.

Immediately after the annealing process, the GITO30 film had high transmittance of 90% or greater in the wavelength range of 450 nm and 90% or greater in the wavelength range near 400 nm, and furthermore the surface resistance was 20Ω/□. In addition, as a result of XRD measurement after the annealing process, a diffraction peak due to the $In_2O_3$ phase was recognized, and it was found that the GITO30 film was crystallized.

Moreover, the obtained semiconductor light-emitting element had a light emission wavelength in the wavelength range near 400 nm, Vf was 3.25 V, and Po was 12 mW, which were good values.

Comparative Example 1

The same semiconductor light-emitting element as that of example 2 was manufactured except that the annealing process was performed at a temperature of 500° C. After annealing, the GITO15 film had characteristics of a transmittance of 85% or greater in the wavelength range of 450 nm and approximately 80% or greater in the wavelength range near 400 nm, with a surface resistance of 21Ω/□. Moreover, the obtained semiconductor light-emitting element had a light emission wavelength in the wavelength range near 400 nm, however, Vf was 3.4 V, and Po was 11 mW, so good values could not be obtained.

Comparative Example 2

The same semiconductor light-emitting element as that of example 2 was manufactured except that the transparent conductive film formed on the p-type GaN contact layer of the gallium nitride semiconductor layer was changed to IZO film, and after patterning of the IZO film, the temperature of the annealing process was 600° C. Here, in the sputtering of the IZO film, an oxide sintered compact target was used in which the amount of zinc oxide contained was 10.7 weight percent.

The IZO film formed by the method described above had transmittance of 90% in the wavelength range of 450 nm and approximately 60% in the wavelength range near 400 nm, and the surface resistance was 19Ω/□. Moreover, the IZO film immediately after film formation by the method described above was found to be amorphous by measuring using the X-ray diffraction (XRD) method.

Immediately after the annealing process, the IZO film was found from X-ray diffraction measurement to be crystallized, however transmittance in the wavelength range near 400 nm only improved to about 75%, and the surface resistance further increased to 27Ω/□. Furthermore, it was clear that after the annealing process, the thickness of the IZO film decreased about 10%. It is thought that by performing the annealing process at a high temperature of 600° C., the zinc component vaporized.

Moreover, the obtained semiconductor light-emitting element had a light emission wavelength in the wavelength range near 400 nm, however, Vf was 3.5 V, and Po was 11 mW, so good values could not be obtained.

[Evaluation]

From the results of example 1, example 5, example 6 and example 7, it is clear that by annealing the transparent conductive comprising an oxide of indium and gallium in a suitable temperature range or atmosphere, the film is maintained in a amorphous state, but the transmittance in the wavelength range of blue color is high, and the surface resistance is low. Moreover, it is also clear that the semiconductor light-emitting elements using these transparent conductive films as a positive electrode show excellent light-emitting properties in the wavelength range of blue color.

From the results of example 2, example 3, example 4, example 8 and example 9, it is clear that by crystallizing the transparent conductive comprising an oxide of indium, gallium and tin after being annealed in a suitable temperature range or atmosphere, transmittance in the wavelength range from ultraviolet to blue is high, and the surface resistance is low. Moreover, it is also clear that the semiconductor light-emitting elements using these transparent conductive films as a positive electrode show excellent light-emitting properties in the wavelength range from ultraviolet to blue.

On the other hand, from the results of comparative example 2, when an IZO film is used as the transparent conductive film and an annealing process is performed within a temperature range (600° C.) that is necessary for crystallizing the IZO film, it is thought that the gallium element existing in the p-type semiconductor layer that is provided directly below the IZO film disperses into the IZO film, which impedes the lowering of the specific resistance and contact resistance. In addition, it was made clear that by performing the annealing process at a high temperature such as 600° C., the zinc component vaporizes, and the thickness of the IZO film decreases by 10%. Therefore, as a result, transmittance in the wavelength range from ultraviolet to blue is not improved, and the surface resistance increases.

Furthermore, as in the case of comparative example 1, even when a transparent conductive film comprising an oxide of indium, gallium and tin is used, when the annealing process is performed at a high temperature that exceeds a specified temperature range, it is thought that as in comparative example 2, the gallium element that exists in the p-type semiconductor layer disperses into the transparent conductive film and impedes the lowering of the specific resistance and contact resistance. Therefore, as a result, transmittance in the wavelength range from ultraviolet to blue is not improved, and lowering of the surface resistance is limited.

Therefore, it is clear that semiconductor light-emitting elements that use the transparent conductive film of these comparative examples as a positive electrode cannot obtain good light-emitting properties in the wavelength range from ultraviolet to blue.

INDUSTRIAL APPLICABILITY

By constructing a lamp using a semiconductor light-emitting element of the present invention, a lamp having excellent light-emitting properties that is capable of efficiently outputting blue light and ultraviolet light.

The invention claimed is:

1. A semiconductor light-emitting element, comprising:
   a compound semiconductor layer that includes at least a p-type semiconductor layer; and
   a transparent electrode that is provided on the p-type semiconductor layer; wherein
   the transparent electrode is formed from a transparent conductive film comprising an oxide of indium and gallium, and
   wherein the amount of gallium contained in the transparent conductive film is at a Ga/(In+Ga) atomic ratio of between about 0.10 and about 0.35.

2. The semiconductor light-emitting element according to claim 1, wherein the transparent conductive film is amorphous.

3. The semiconductor light-emitting element according to claim 1, wherein the compound semiconductor layer has a light-emitting wavelength in at least the range of between about 350 nm to about 500 nm.

4. The semiconductor light-emitting element according to claim 1, wherein the compound semiconductor layer is a gallium nitride semiconductor layer.

5. The semiconductor light-emitting element according to claim 1, wherein the transparent conductive film has transmittance of 85% or greater in the wavelength range near 450 nm.

6. The semiconductor light-emitting element according to claim 1, wherein the transparent conductive film has transmittance of 80% or greater in the wavelength range near 400 nm.

7. The semiconductor light-emitting element according to claim 1, wherein the surface resistance of the transparent conductive film is 20Ω/□ or less.

8. The semiconductor light-emitting element according to claim 1, wherein the thickness of the transparent conductive film is 10 nm to 1000 nm.

9. The semiconductor light-emitting element according to claim 1, wherein a protective layer is formed on the transparent electrode.

10. A semiconductor light-emitting element, comprising:
    a compound semiconductor layer that includes at least a p-type semiconductor layer; and
    a transparent electrode that is provided on the p-type semiconductor layer; wherein the transparent electrode is made from a transparent conductive film comprising an oxide of indium, gallium and tin;
    wherein the amount of gallium contained in said transparent conductive film is at a Ga/(In+Ga+Sn) atomic ratio of between about 0.02 and about 0.30, and the amount of tin contained is at a Sn/(In+Ga+Sn) atomic ratio of between about 0.01 and about 0.11; and
    the transparent conductive film is crystallized.

* * * * *